(12) United States Patent
Hsieh

(10) Patent No.: US 7,999,612 B2
(45) Date of Patent: Aug. 16, 2011

(54) OPERATIONAL AMPLIFIER HAVING DC OFFSET CANCELLATION CAPABILITY

(75) Inventor: Yi-Bin Hsieh, Taipei County (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 18 days.

(21) Appl. No.: 12/695,137

(22) Filed: Jan. 27, 2010

(65) Prior Publication Data

US 2011/0018633 A1    Jan. 27, 2011

(30) Foreign Application Priority Data

Jul. 22, 2009  (TW) .............................. 98124721 A

(51) Int. Cl.
*H03F 3/45* (2006.01)

(52) U.S. Cl. .......................................... 330/69; 330/258

(58) Field of Classification Search .................... 330/69, 330/258, 259
See application file for complete search history.

(56) References Cited

U.S. PATENT DOCUMENTS 7,808,317 B1 * 10/2010 Cui et al. ...................... 330/252
7,839,212 B2 * 11/2010 Huang et al. ................... 330/69
* cited by examiner

*Primary Examiner* — Steven J Mottola
(74) *Attorney, Agent, or Firm* — Winston Hsu; Scott Margo

(57) ABSTRACT

An operational amplifier includes an input stage for generating a first differential output signal pair according to a first differential input signal pair, an output stage for generating a second differential output signal pair according to at least a second differential input signal pair, and a high-pass filtering circuit coupled between the input stage and the output stage for performing high-pass filtering on the first differential output signal pair, for generating the at least a second differential input signal pair.

5 Claims, 8 Drawing Sheets

OPERATIONAL AMPLIFIER HAVING DC OFFSET CANCELLATION CAPABILITY

BACKGROUND OF THE INVENTION

1. Field of the Invention

The present invention relates to an operational amplifier, and more particularly, to an operational amplifier with inherent direct current (DC) offset cancellation.

2. Description of the Prior Art

A fully differential operational amplifier is widely used in various high-speed applications, such as a communication system and audio/video processing system. A general fully differential amplifier consists of an input stage and an output stage, where the input stage provides high gain and the output stage provides required output swings.

Please refer to FIG. 1, which is a schematic diagram of an operational amplifier 10 according to the prior art. The operational amplifier 10 is a fully differential operational amplifier including an input stage 11 and an output stage 12. The input stage 11 includes p-type transistors MP1-MP4 and n-type transistors MN1-MN5, forming four differential pairs and a common mode feedback circuit 100 that generates an output common mode voltage of the input stage 11. The output stage 12 includes p-type transistors MP6, MP7, n-type transistors MN6, MN7, the capacitors CM1, CM2, and a common mode feedback circuit 102. Bias voltages VBP1, VBP2, VBN1, VBN2, and VBN3 are used in differential pairs in the input stage 11 and the output stage 12. The input stage 11 receives differential input signals INP and INN, and generates differential output signals VOP and VON. The output stage 12 receives the differential output signals generated by the input stage 11, and generates differential output signals OUTP and OUTN. In FIG. 1 and the following figures, the common mode feedback circuit is abbreviated to CMFB.

There are some disadvantages in the operational amplifier 10. For example, the output stage 12 has a small transconductance and a low parasitic pole resulted from the use of the transistors MP6 and MP7. Also, sink current of the output stage 12 is a fixed value due to the fixed bias voltage VBN3 that controls gate voltages of the transistors MN6 and MN7. As shown in FIG. 1, the output common mode voltage of the input stage 11 is determined by the input common mode voltage of the output stage 12, which easily results in a headroom issue that occurs in the input stage 11 and makes the transistors MP1-MP4 operate in a triode region. The output common mode voltage of the input stage 11 varies in several hundred-mV, which is influenced by the manufacturing process, supplying power, and temperature. Therefore, ideal gain is hard to achieve in a low supplying voltage design like 1.2V.

Please refer FIG. 2, which is a schematic diagram of an operational amplifier 20 according to the prior art. The operational amplifier 20 includes an input stage 21, an AB-class output stage 22, and a switched capacitor level shifter 23. The input stage 21 includes p-type transistor MP1-MP4, n-type transistors MN1-MN5, and a common mode feedback circuit 200. The output stage 22 includes p-type transistors MP6-MP7, n-type transistors MN6-MN9, the capacitors CM1, CM2, and a common mode feedback circuit 202. The switched capacitor level shifter 23 consists of switches S1-S16 and capacitors C1-C8, and is utilized for decoupling the input stage 21 and the output stage 22. By the use of the switched capacitor level shifter 23, the output common mode voltage of the input stage 21 is no longer determined by the input common mode voltage of the output stage 22, so that the headroom issue is solved. Bias voltages VBP1, VBP2, VBN1, and VBN2 are used in the input stage 21, and bias voltages VBP3, VBN3 and VC are used in the switched capacitor level shifter 23.

Compared to the operational amplifier 10, the operational amplifier 20 prevents the headroom issue that may happen in the input stage, but there are still some disadvantages left. For example, a lot of switches and capacitors and control circuit are required in the switched capacitor level shifter 23, which means a large cost. Note that, the transistors MN8 and MP8 in the common mode feedback circuit 202 operate as a common mode loop gain amplifier and produce a larger capacitive load, and lead to a smaller bandwidth, a smaller phase margin, and increasing instability. The operational amplifier 20 are restricted to be applied in the switched-capacitor type circuits as pipelined ADCs due to the switched capacitor level shifter 23, and cannot be used in continuous-time type circuits as active RC filters and programmable gain amplifiers (PGA).

The operational amplifier 10 can be used in a programmable gain amplifier. Please refer FIG. 3, which is a schematic diagram of a programmable gain amplifier 30 according to the prior art. The programmable gain amplifier 30 has an inherent DC offset cancellation function, and is widely used in the systems requiring high gain as a wireless communication system. The programmable gain amplifier 30 includes an operational amplifier 300, resistors R1-R4, RH1, RH2, capacitors CH1, and CH2, wherein the operational amplifier 300 is as the operational amplifier 10. The resistors RH1, RH2, the capacitors CH1, and CH2 forms a high-pass filtering circuit used for cancel DC offset voltage across differential output terminals of the operational amplifier 300. Assume that resistances of the resistors RH1 and RH2 are equal, denoted as $R_H$, capacitances of the capacitors CH1 and CH2 are equal, denoted as $C_H$, and resistances of the resistors R1 and R2 are $R_1$ and $R_2$, a transfer function of an output signal $V_o$ to an input signal $V_i$ of the programmable gain amplifier 30 is $$\frac{V_o}{V_i} = \frac{R_2}{R_1} \frac{1}{1 + \frac{1 + R_2/R_1}{A}} \frac{sR_H C_H}{1 + sR_H C_H}, \qquad (1)$$

where A is a gain of the operational amplifier 300. When A is large, the equation 1 can be simplified as follows:

$$\frac{V_o}{V_i} = \frac{R_2}{R_1} \frac{sR_H C_H}{1 + sR_H C_H}, \qquad (2)$$

where s is a complex frequency. A corner frequency of the high-pass filtering circuit is equal to $1/R_H C_H$.

Please refer to FIG. 4, which is a schematic diagram of a programmable gain amplifier 40 with an inherent DC offset cancellation function according to the prior art. The programmable gain amplifier 40 includes operational amplifiers 400, 402, resistors R1-R6, RH1, RH2, capacitor CH1, and CH2. The programmable gain amplifier 40 utilizes an active integrator that consists of the operational amplifier 402, the resistors RH1, RH2, the capacitors CH1, and CH2 to perform high-pass filtering. Assume that resistances of the resistors RH1 and RH2 are equal, denoted as $R_H$, capacitances of the capacitors CH1 and CH2 are equal, denoted as $C_H$, a transfer function of an output signal $V_o$ to an input signal $V_i$ of the programmable gain amplifier 40 is identical to the equation 1 and the equation 2.

From the above, when the number of programmable gain amplifiers in a programmable gain amplifier series increases, the number of components for implementing the DC offset cancellation function increases correspondingly, which results in a large cost.

SUMMARY OF THE INVENTION

It is therefore a primary objective of the claimed invention to provide an operational amplifier with inherent DC offset cancellation.

The present invention discloses an operational amplifier including an input stage, an output stage, and a high-pass filtering circuit coupled between the input stage and the output stage. The input stage is utilized for generating a first differential output signal pair according to a first differential input signal pair. The output stage is utilized for generating a second differential output signal pair according to at least a second differential input signal pair. The high-pass filtering circuit is utilized for performing high-pass filtering on the first differential output signal pair, for generating the at least a second differential input signal pair.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
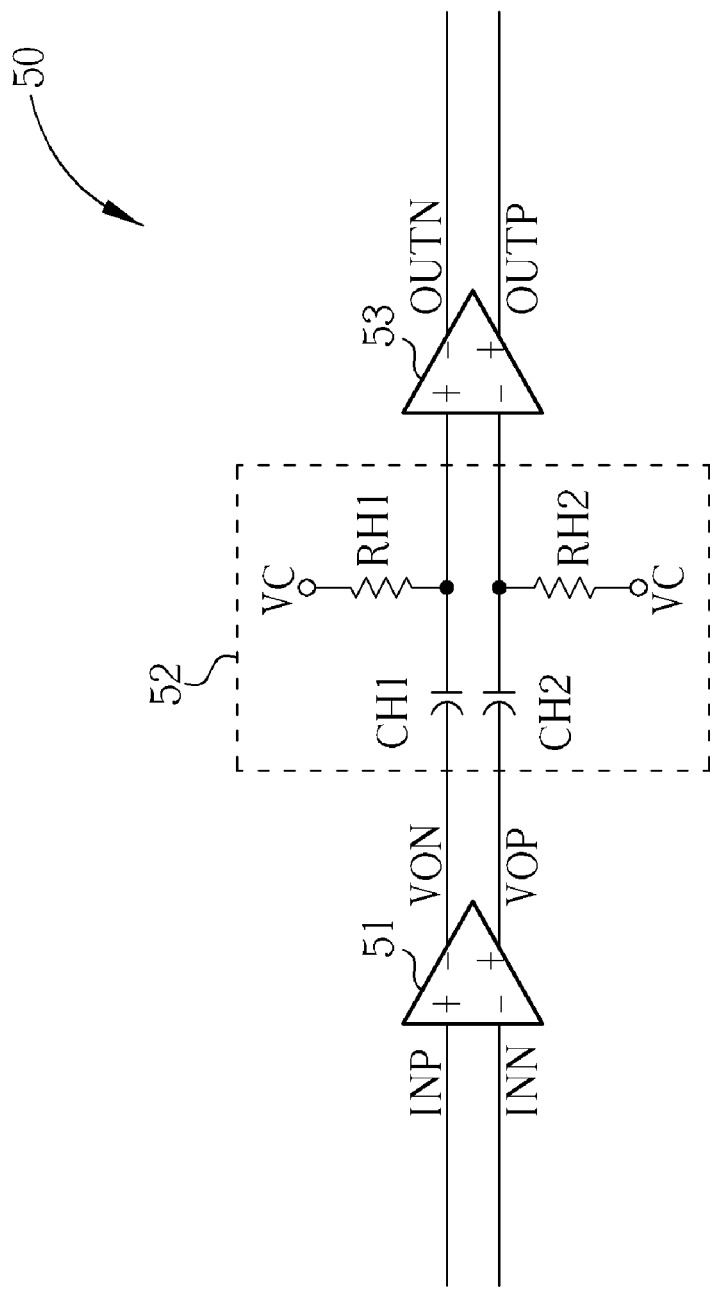
FIG. 5 is a schematic diagram of an operational amplifier according an embodiment of the present invention.

Please refer to FIG. 5, which is a schematic diagram of an operational amplifier 50 according an embodiment of the present invention. The operational amplifier 50 comprises an input stage 51, a high-pass filtering circuit 52, and an output stage 53. The input stage 51 receives differential input signals INP and INN, and generates differential output signals VON and VOP according to the differential input signals INP and INN. The output stage 53 generates differential output signals OUTP and OUTN according to signals outputted by the high-pass filtering circuit 52. The high-pass filtering circuit 52 includes capacitors CH1, CH2, resistors RH1, and RH2, wherein the capacitor CH1 and the resistor RH1 form a high-pass filtering unit between a negative output terminal of the input stage 51 and a positive input terminal of the output stage 53, and the capacitor CH2 and the resistor RH2 form another high-pass filtering unit between a positive output terminal of the input stage 51 and a negative input terminal of the output stage 53. The resistor RH1 is coupled between the capacitor CH1 and a bias voltage VC; the resistors RH2 is coupled between the capacitor CH2 and the bias voltage VC. The high-pass filtering circuit 52 is utilized for filtering DC signals existed in the differential output signals VON and VOP, and the bias voltage VC controls a common mode voltage of different output signals of the high-pass filtering circuit 52. Therefore, a DC voltage offset does not exist in differential input signals of the output stage 53, which is the reason why the operational amplifier 50 is widely used in the circuit that is sensitive to the DC offset and requires high gain, such as an active RC filter or a programmable gain amplifier (PGA).

Figure 6:
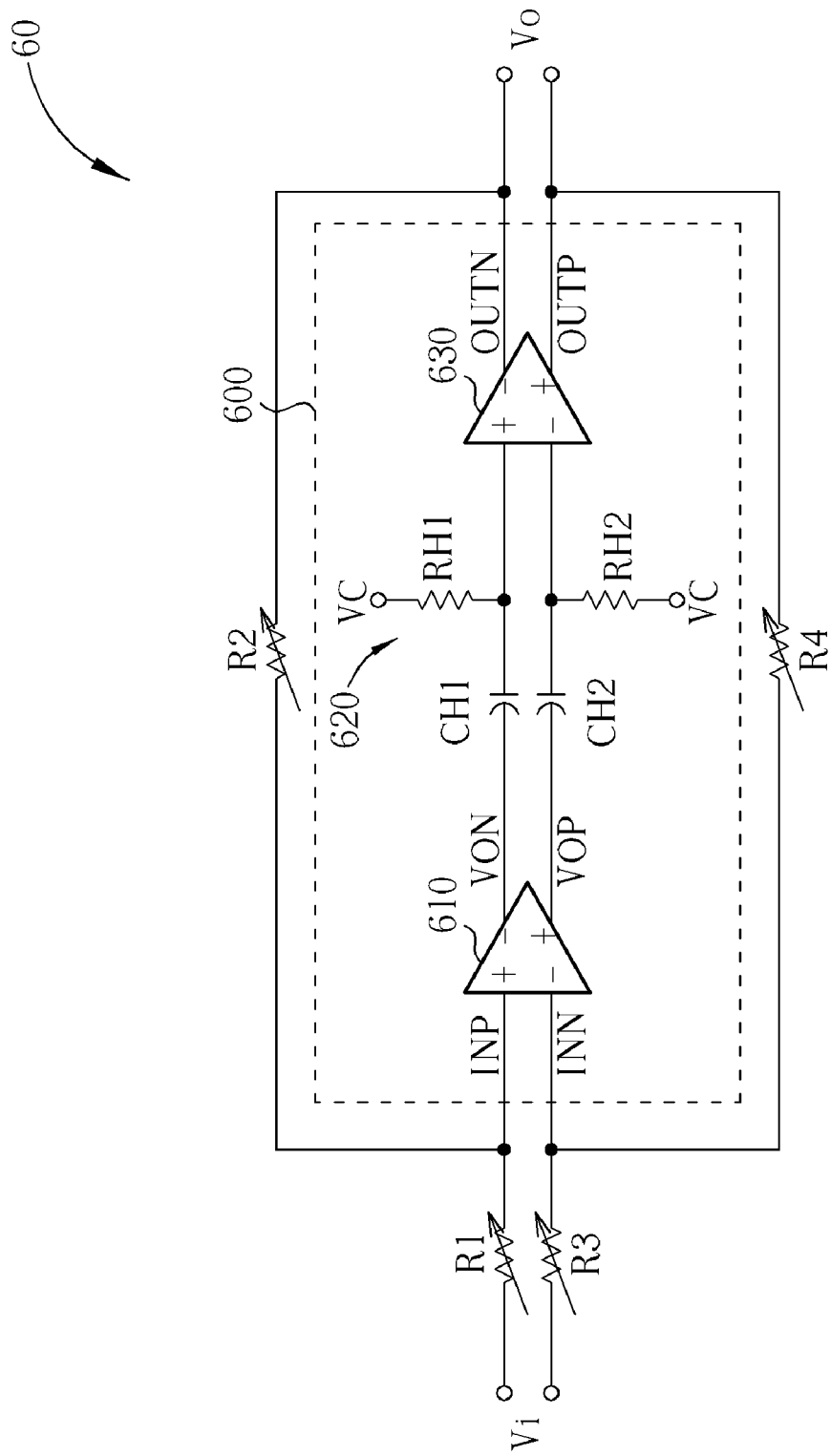
FIG. 6 is a schematic diagram of a programmable gain amplifier according to an embodiment of the present invention.

Please refer to FIG. 6, which is a schematic diagram of a programmable gain amplifier 60 according to an embodiment of the present invention. The programmable gain amplifier 60 comprises an operational amplifier 600 and resistors R1-R4. The operational amplifier 600 comprises an input stage 610, a high-pass filtering circuit 620, and an output stage 630, wherein the high-pass filtering circuit 620 comprises capacitors CH1, CH2, resistors RH1, and RH2. The operational amplifier 600 is identical to the operational amplifier 50 shown in FIG. 5, and thereby detailed description of the operational amplifier 600 is omitted herein. Assume that a gain of the input stage 610 is $A_1$, a gain of the output stage 630 is $A_2$, resistances of the resistors R1 and R2 are $R_1$ and $R_2$, resistances of the resistors RH1 and RH2 are the same, denoted as $R_H$, capacitances of the capacitor CH1 and CH2 are the same, denoted as $C_H$, and the complex frequency is denoted as s, a transfer function of output signal $V_o$ to input signal $V_i$ is:

$$\frac{V_o}{V_i} = \frac{R_2}{R_1} \frac{1}{1 + \frac{1 + sR_H C_H}{sR_H C_H A_1 A_2}\left(1 + \frac{R_2}{R_1}\right)}. \quad (3)$$

When a total gain of the operational amplifier 600, $A = A_1 \times A_2$, is large enough, the above equation 3 is simplified as:

$$\frac{V_o}{V_i} \approx \frac{R_2}{R_1} \frac{sR_H C_H A_1 A_2 \frac{R_2}{R_1 + R_2}}{1 + sR_H C_H A_1 A_2 \frac{R_2}{R_1 + R_2}}. \quad (4)$$

Figure 3:
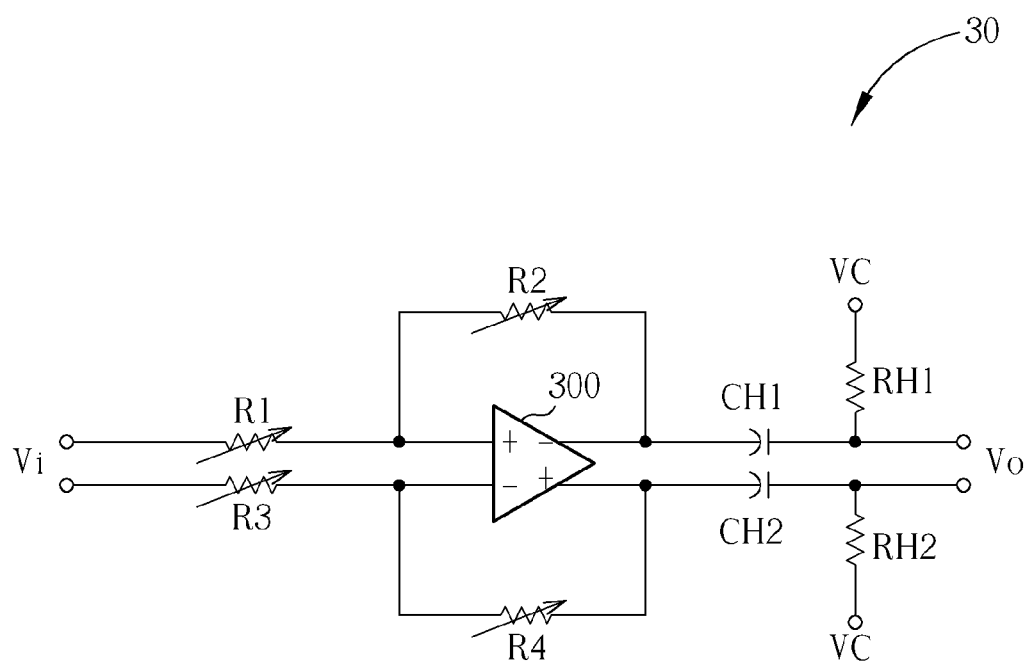
FIG. 3 is a schematic diagram of a programmable gain amplifier according to the prior art.
Figure 4:
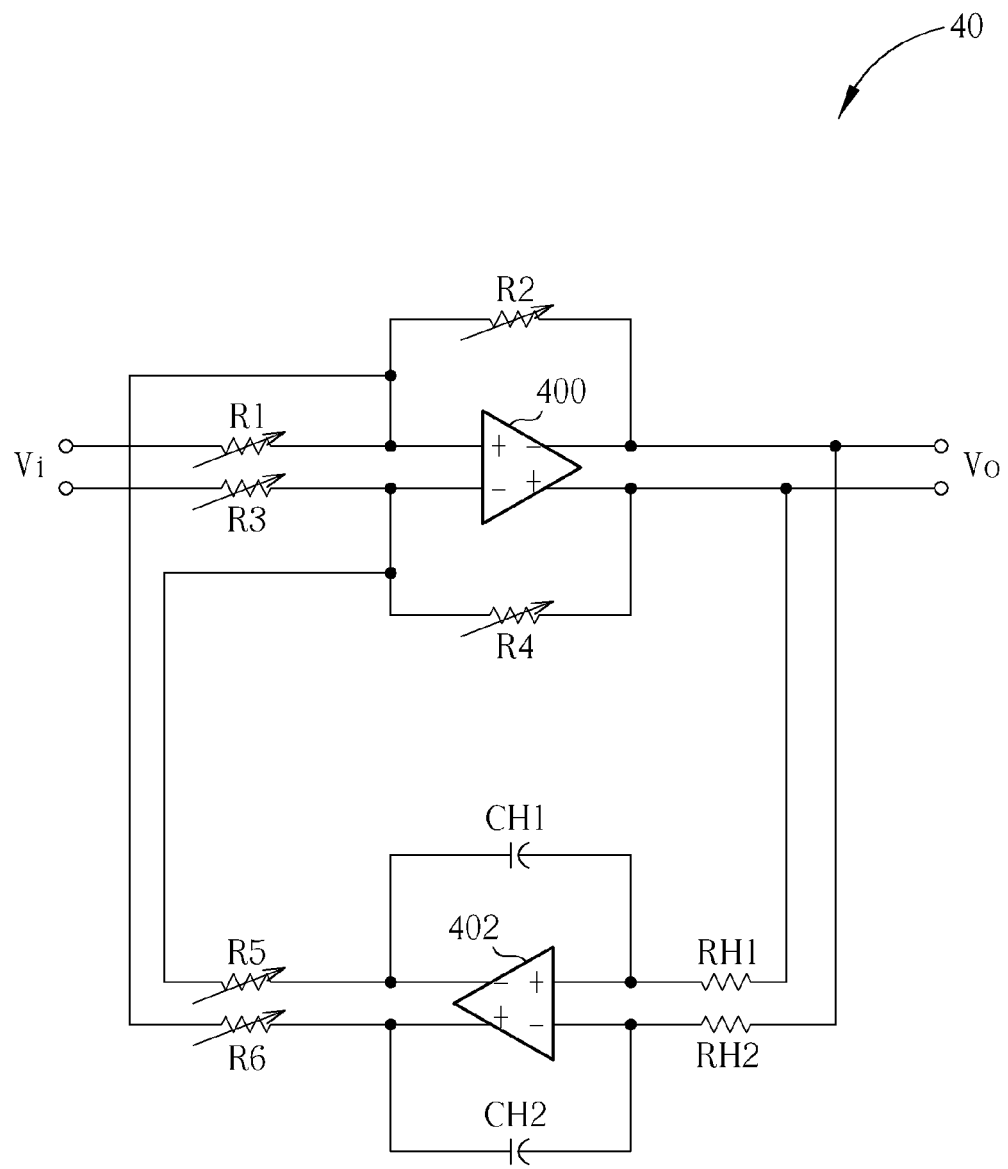
FIG. 4 is a schematic diagram of a programmable gain amplifier with an inherent DC offset cancellation function according to the prior art.

As shown in the equation 4, the corner frequency of the high-pass filtering circuit 620 decreases to $$\frac{1}{R_H C_H A_1 A_2 \frac{R_2}{R_1 + R_2}}$$

from $1/R_H C_H$ that is the corner frequency of the conventional programmable gain amplifier 30 in FIG. 3. The capacitor enhancement factor is equal to $AR_2/(R_1+R_2)$. Take the operational amplifier 600 as an example, when a total gain of the operational amplifier 600 is 1000 and a gain of the PGA 60, $R_2/R_1$, is 20, the corner frequency of the high-pass filtering circuit 620 can be 1/50 of the corner frequency of the conventional high-pass filtering circuit. Or, the area occupied by the capacitors is reduced by 50 times compared to the conventional high-pass filtering circuit.

In the prior art, when the number of programmable gain amplifiers in a programmable gain amplifier series increases, the number of components of the high-pass filtering circuit increases correspondingly. Although the DC offset can be cancelled by the conventional programmable gain amplifier, production cost also increases. In comparison, the present invention installs the high-pass filtering circuit between the input stage and the output stage, so that a programmable gain amplifier that applies the operational amplifier according to the present invention requires no additional DC offset cancellation circuit. Furthermore, area occupied by capacitors in the high-pass filtering circuit is far less than area occupied by capacitors in the conventional switched capacitor level shifter. When the number of programmable gain amplifiers in a programmable gain amplifier series increases, the increased cost are considerably less than that in the prior art.

Figure 7:
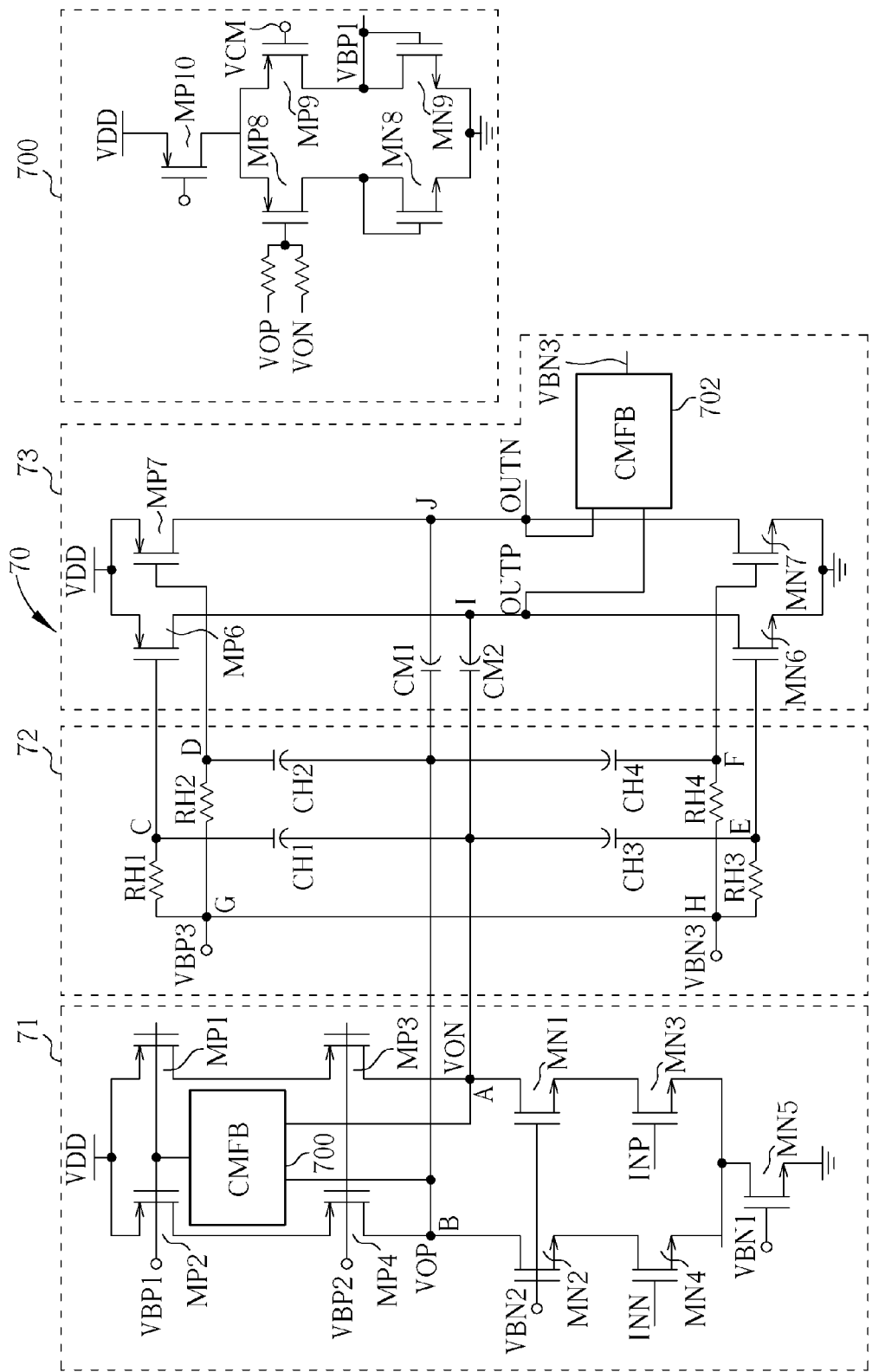
FIG. 7 is a schematic diagram of an operational amplifier according to an embodiment of the present invention.

Please note that, the operational amplifier 50 in FIG. 5 is a simplified embodiment of the present invention, and the present invention also provides other embodiments as follows in order to describe the input stage, the output stage, and the high-pass filtering circuit in detail. Please refer to FIG. 7, which is a schematic diagram of an operational amplifier 70 according to an embodiment of the present invention. The operational amplifier 70 comprises an input stage 71, a high-pass filtering circuit 72, and an AB-class output stage 73. The input stage 71 comprises p-type transistors MP1-MP4, n-type transistors MN1-MN5, and a common mode feedback circuit 700. The high-pass filtering circuit 72 comprises resistors RH1-RH4 and capacitors CH1-CH4, forming four high-pass filtering units, respectively. The output stage 73 comprises p-type transistors MP6, MP7, n-type transistors MN6, MN7, capacitors CM1, CM2, and a common mode feedback circuit 702. As can be seen in FIG. 7, parts of input/output terminals and terminals of the transistors are denoted as nodes A-J.

In the input stage 71, the transistors MP1 and MP2 form a differential pair. The source of the transistor MP1 and the source of the transistor MP2 are coupled to a voltage VDD; the gate of the transistor MP1 and the gate of the transistor MP2 are coupled to the common mode feedback circuit 700, and are controlled by a bias voltage VBP1 outputted from the common mode feedback circuit 700. The transistors MP3 and MP4 form a differential pair. The gate of the transistor MP3 and the gate of the transistor MP4 are coupled to a bias voltage VBP2; the source of the transistor MP3 is coupled to the drain of the transistor MP1; the source of the transistor MP4 is coupled to the drain of the transistor MP2. The transistors MN1 and MN2 form a differential pair. The gate of the transistor MN1 and the gate of the transistor MN2 are coupled to a bias voltage VBN2; the drain of the transistor MN1 is coupled to the drain of the transistor MP3, which is also a negative output terminal of the input stage 71 for outputting a negative output signals VON, denoted as the node A, The drain of the transistor MN2 is coupled to the drain of the transistor MP4, which is also a positive output terminal of the input stage 71 for outputting a positive output signals VOP, denoted as the node B. The transistors MN3 and MN4 form a differential pair. The gate of the transistor MN3 and the gate of the transistor MN4 are differential input terminals of the input stage 71, and are utilized for receiving the differential input signals INP and INN. The drain of the transistor MN3 is coupled to the source of the transistor MN1; the drain of the transistor MN4 is coupled to the source of the transistor MN2. The drain of the transistor MN5 is coupled to the source of the transistor MN3 and the source of the transistor MN4; the source of the transistor MN5 is coupled to a ground; and the gate of the transistor MN5 is coupled to a bias voltage VBN1.

The common mode feedback circuit 700 is coupled to the node A, the node B, and the gates of the transistors MP1 and MP2, and is utilized for generating the bias voltage VBP1 that controls the gate of the transistors MP1 and MP2. As shown in FIG. 7, the common mode feedback circuit 700 comprises p-type transistors MP8-MP10 and n-type transistors MN8 and MN9. A bias voltage VCM that controls the gate of the transistor MP9 is a predetermined voltage, which is the output common mode voltage of the input stage 71. The output common mode voltage of the input stage 71 is controlled to be equal to the bias voltage VCM through the common mode feedback circuit 700. How the output common mode voltage of the input stage 71 can follow the bias voltage VCM is well-known to those skilled in the art, and is not given herein.

In FIG. 7, input terminals of the output stage 73 are the gates of the transistors MP6, MP7, MN6, and MN7, as the nodes C, D, E, and F, respectively. In the high-pass filtering circuit 72, the capacitor CH1 and the resistor RH1 form a high-pass filtering unit HPF1. The capacitor CH1 is coupled between the node A and the node C, and the resistor RH1 is coupled between the node C and the node G, wherein the node G is coupled to a bias voltage VBP3. The capacitor CH2 and the resistor RH2 form a high-pass filtering unit HPF2. The capacitor CH2 is coupled between the node B and the node D, and the resistor RH2 is coupled between the node D and the node G. The high-pass filtering units HPF1 and HPF2 perform high-pass filtering on the differential output signals VON and VOP outputted from the input stage 71, and generate a first differential input signal pair that is outputted to the output stage 73. The bias voltage VBP3 is utilized for being a common mode voltage of the first differential input signal pair.

Similarly, the capacitor CH3 and the resistor RH3 form a high-pass filtering unit HPF3. The capacitor CH3 is coupled between the node A and the node E, and the resistor RH3 is coupled between the node E and the node H, wherein the node H is coupled to a bias voltage VBN3. The capacitor CH4 and the resistor RH4 form a high-pass filtering unit HPF4. The capacitor CH4 is coupled between the node B and the node F, and the resistor RH4 is coupled between the node F and the node H. The high-pass filtering units HPF3 and HPF4 perform high-pass filtering on the differential output signals VON and VOP, and generate a second differential input signal pair that is outputted to the output stage 73. The bias voltage VBN3 is utilized for being an input common mode voltage of the second differential input signal pair.

In the output stage 73, the drain of the transistor MP6 is coupled to the drain of transistor MN6 at the node I, which is also a positive output terminal of the output stage 73 that outputs a positive output signal OUTP. The drain of the transistor MP7 is coupled to the drain of the transistor MN7 at the node J, which is also a negative output terminal of the output stage 73 that outputs a negative output signal OUTN. The source of the transistor MP6 and the source of the transistor MP7 are coupled to the voltage VDD. The source of the transistor MN6 and the source of the transistor MN7 are coupled to the ground. The capacitors CM1 and CM2 are Miller compensation capacitor; the capacitor CM1 is coupled between the node B and the node J; the capacitor CM2 is coupled between the node A and the node I. The common mode feedback circuit 702 is coupled to the node I, the node J and the node H, and is utilized for generating the bias voltage VBN3 that is fed back to the node H. An output common mode voltage of the differential output signals OUTP and OUTN can be equal to a predetermined bias voltage through the common mode feedback circuit 700. The common mode feedback circuit 702 is similar to the common mode feedback circuit 700 in the input stage 71, and is omitted herein.

Briefly, the high-pass filtering circuit 72 performs high-pass filtering on the differential output signals VOP and VON of the input stage 71 to cancel the DC offset in the differential output signals, and uses the bias voltages VBP3 and VBN3 to control the common mode voltage of the differential input signals of the output stage 73. In other words, the high-pass filtering circuit 72 decouples the input stage 71 and the output stage 73, so that the differential output signals of the input stage 71 are not affected by the differential input signals of the output stage 73. Compared to the operational amplifier 10 in FIG. 1, the operational amplifier 70 solve the headroom issue easily happening in the input stage, and therefore, circuit design is simpler under a low supplying voltage.

Figure 1:
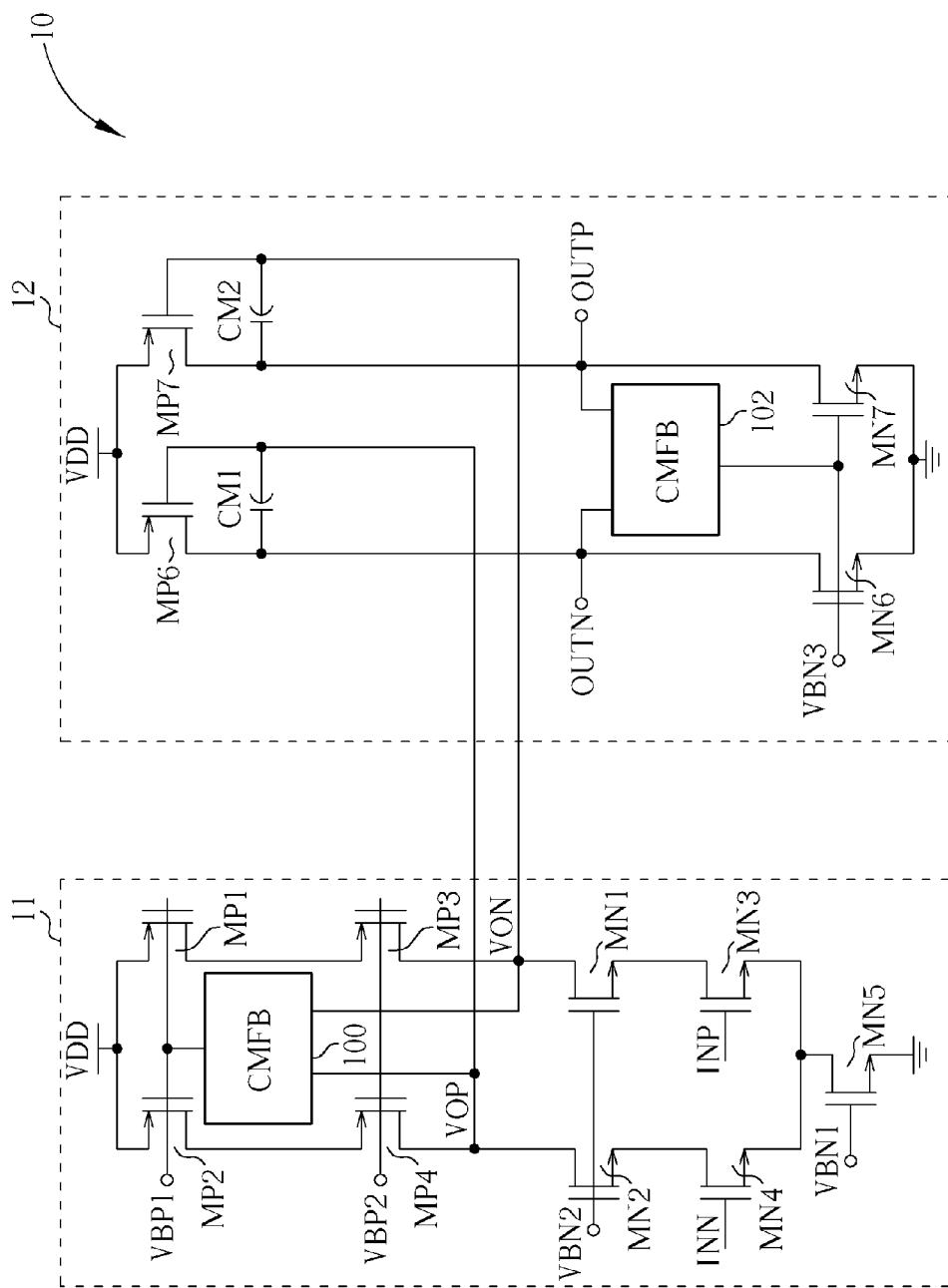
FIG. 1 is a schematic diagram of an operational amplifier according to the prior art.
Figure 2:
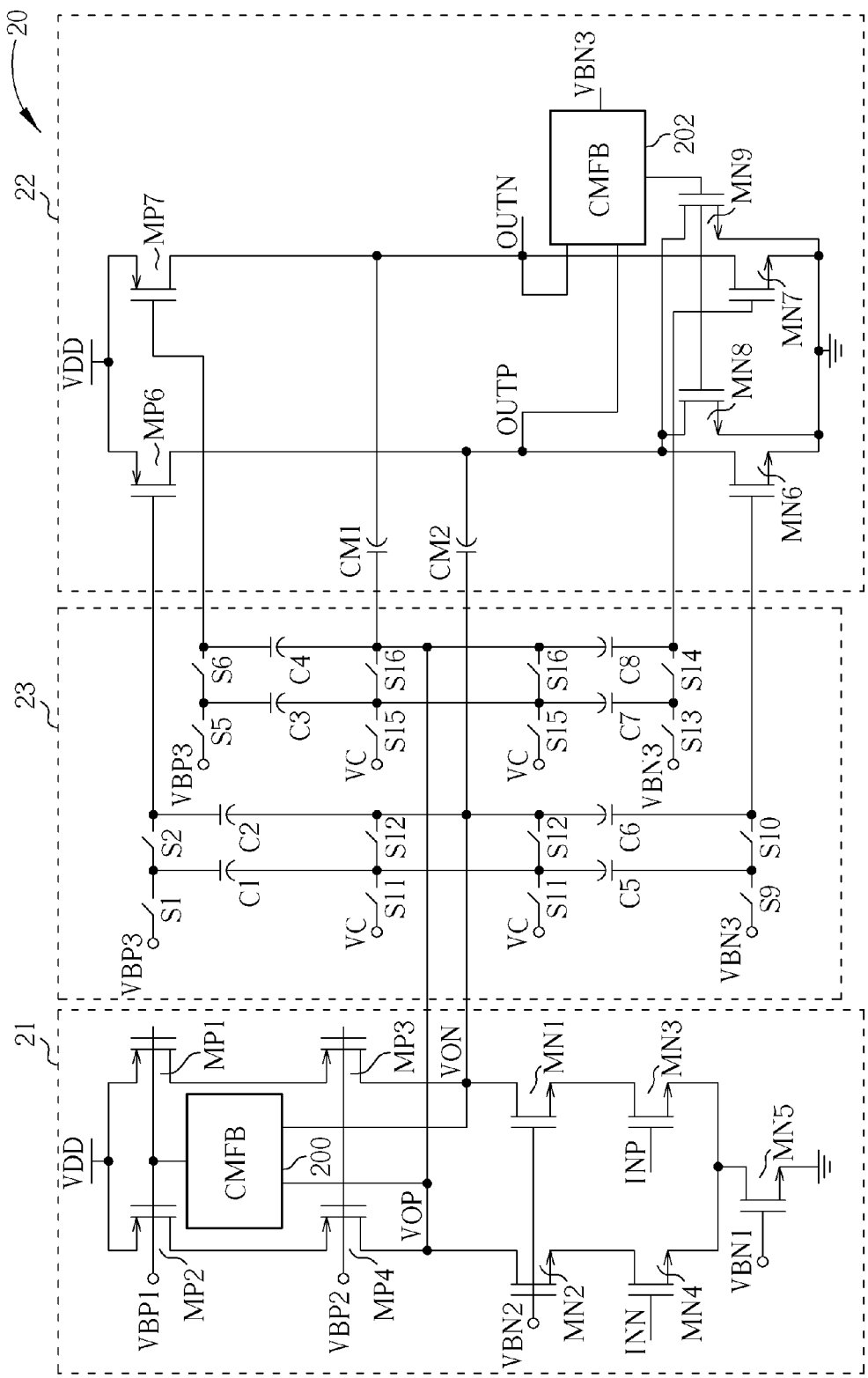
FIG. 2 is a schematic diagram of an operational amplifier according to the prior art.

Compared to the prior art in FIG. 1 in which the differential input signals of the output stage 12 control a p-type transistor pair only, the differential input signals of the output stage 73 control a p-type transistor pair and an n-type transistor pair, so that the gain of the output stage 73 is twice than the gain of the output stage 12. Although the operational amplifier 20 in FIG. 2 can also decouple the input stage 21 and the output stage 22, required components of the switched capacitor level shifter 23 are far more than that of the high-pass filtering circuit 72. The operational amplifier 20 can only be applied in a switched-capacitor type circuit as a pipelined ADC and cannot be applied in a continuous-time type circuit, such as an active RC filter and a programmable gain amplifier, whereas the operational amplifier 70 can be applied in the continuous-time type circuit. Moreover, the transistors MN8 and MP8 in the output stage 22 result in a lower phase margin. In comparison, the operational amplifier 70 improves the phase margin since the operational amplifier 70 does not include components as the transistors MN8 and MP8 in the output stage 22 in FIG. 2. Therefore, the operational amplifier 70 has a lower cost and be applied in more application circuits.

Figure 8:
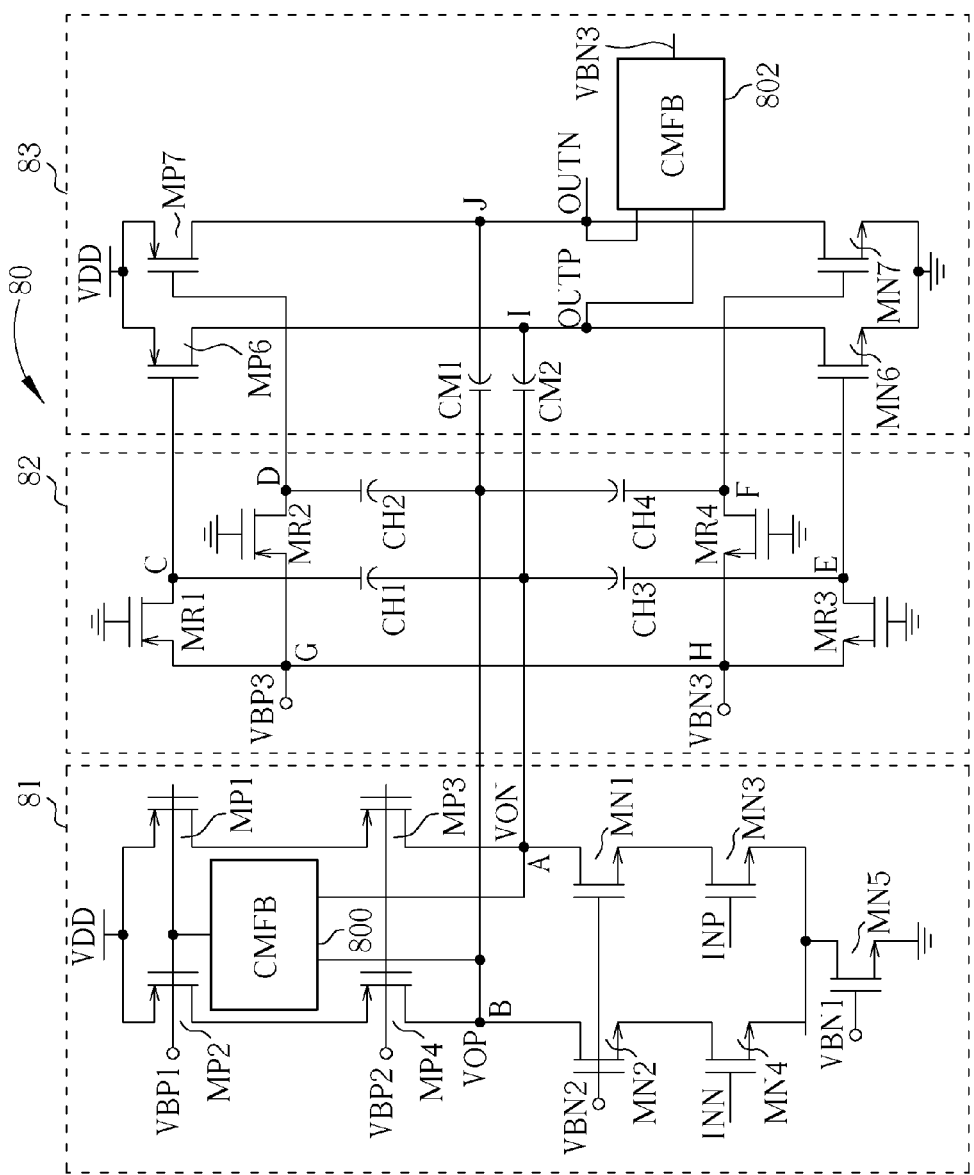
FIG. 8 is a schematic diagram of an operational amplifier according to an embodiment of the present invention.

In another embodiment of the present invention, the resistors RH1-RH4 in the high-pass filtering circuit 72 are replaced with other resistive components. Please refer to FIG. 8, which is a schematic diagram of an operational amplifier 80 according to an embodiment of the present invention. The operational amplifier 80 comprises an input stage 81, a high-pass filtering circuit 82, and an output stage 83. The input stage 81 comprises p-type transistors MP1-MP4, n-type transistors MN1-MN5, and a common mode feedback circuit 800. The output stage 83 comprises p-type transistors MP6, MP7, n-type transistors MN6, MN7, capacitors CM1, CM2, and a common mode feedback circuit 802. The input stage 81 and the output stage 83 are similar to the input stage 71 and the output stage 73 in FIG. 7, and are not repeated herein. The high-pass filtering circuit 82 comprises p-type transistors MR1, MR2, n-type transistors MR3, MR4, and capacitors CH1-CH4, wherein each of the transistors MR1-MR4 can be a metal-oxide-semiconductor field effect transistor (MOSFET) which is equivalent to a resistor when operating in a triode region. That is, the resistors RH1-RH4 in FIG. 7 are replaced with the transistors MR1-MR4. The source of the transistor MR1 is coupled to the node G, and the drain of the transistor MR1 is coupled to the node C. The source of the transistor MR2 is coupled to the node G, and the drain of the transistor MR2 is coupled to the node D. The source of the transistor MR3 is coupled to the node H, and the drain of the transistor MR3 is coupled to the node E. The source of the transistor MR4 is coupled to the node H, and the drain of the transistor MR4 is coupled to the node F. The high-pass filtering circuit 82 performs high-pass filtering as the operational amplifier 70 does, so that DC offset voltage is cancelled from the differential output signals OUTP and OUTN.

Please note that, the operational amplifier 70 and the operational amplifier 80 are embodiments of the present invention, and those skilled in the art can make alterations and modifications accordingly. For example, in FIG. 7, the output voltage of the common mode feedback circuit 702 can be the input common mode voltage of one of the differential input signal pairs of the output stage 73, e.g. the bias voltage VBP3, instead of the bias voltage VBN3. In other words, the output voltage of the common mode feedback circuit 702 can be fed back to the node H, or to the node G. The input stage of the operational amplifier 70 (or the operational amplifier 80) is a telescopic operational amplifier; in another embodiment, the input stage can also be a folded-cascode operational amplifier, which does not influence functions of the high-pass filtering circuit. Besides, the output stage in the operational amplifier according to the present invention is not limited to an A-class or AB-class output stage. Anyone who uses a high-pass filtering circuit between an input stage and an output stage for DC offset cancellation should be included in the present invention.

In conclusion, the operational amplifier according to the present invention uses the high-pass filtering circuit with the most simplified components, to decouple the input stage and the output stage, so that the input stage and the output stage can be designed independently, and thereby the DC offset voltage of differential output signals of the input stage is cancelled.

Those skilled in the art will readily observe that numerous modifications and alterations of the device and method may be made while retaining the teachings of the invention.

What is claimed is:

1. An operational amplifier comprising:
   an input stage for generating a first differential output signal pair according to a first differential input signal pair;
   an output stage for generating a second differential output signal pair according to at least a second differential input signal pair; and
   a high-pass filtering circuit coupled between the input stage and the output stage for performing high-pass filtering on the first differential output signal pair, for generating the at least a second differential input signal pair;
   wherein the high-pass filtering circuit is coupled to at least one bias voltage, each bias voltage is a common mode voltage of one of the at least a second differential input signal pair, and the output stage comprises a common mode feedback circuit for generating one of the at least one bias voltage.

2. The operational amplifier of claim 1, wherein the high-pass filtering circuit comprises a plurality of high-pass filtering units, each high-pass filtering unit being coupled to one of a plurality of output terminals of the input stage, one of a plurality of input terminals of the output stage, and a bias voltage.

3. The operational amplifier of claim 1, wherein the high-pass filtering circuit comprises a plurality of high-pass filtering units, each high-pass filtering unit comprising:
   a capacitor coupled between one of a plurality of output terminals of the input stage and one of a plurality of input terminals of the output stage; and
   a resistive component coupled between the output terminal and a bias voltage which is a common mode voltage of one of the at least a second differential input signal pair.

4. The operational amplifier of claim 3, wherein the resistive component is a resistor.

5. The operational amplifier of claim 3, wherein the resistive component is a metal-oxide-semiconductor field effect transistor.

* * * * *